(12) United States Patent
Walke et al.

(10) Patent No.: US 10,367,031 B2
(45) Date of Patent: Jul. 30, 2019

(54) SEQUENTIAL INTEGRATION PROCESS

(71) Applicant: IMEC VZW, Leuven (BE)

(72) Inventors: Amey Mahadev Walke, Heverlee (BE); Anne Vandooren, Mazy (BE); Nadine Collaert, Blanden (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/701,743

(22) Filed: Sep. 12, 2017

(65) Prior Publication Data

US 2018/0076260 A1 Mar. 15, 2018

(30) Foreign Application Priority Data

Sep. 13, 2016 (EP) .................................. 16188504

(51) Int. Cl.
*H01L 23/40* (2006.01)
*H01L 27/148* (2006.01)
*H01L 21/768* (2006.01)
*H01L 21/822* (2006.01)
*H01L 27/06* (2006.01)
(Continued)

(52) U.S. Cl.
CPC .. *H01L 27/14875* (2013.01); *H01L 21/76898* (2013.01); *H01L 21/8221* (2013.01); *H01L 27/0688* (2013.01); *H01L 27/0694* (2013.01); *H01L 29/41708* (2013.01); *H01L 31/02164* (2013.01); *B28D 1/005* (2013.01); *H01L 21/304* (2013.01); *H01L 21/8258* (2013.01); *H01L 31/022408* (2013.01)

(58) Field of Classification Search
CPC ............... H01L 23/4012; H01L 25/043; H01L 25/0657; H01L 25/0756; H01L 21/2007; H01L 2224/01; H01L 27/14875; H01L 31/02164; H01L 29/41708; H01L 31/022408; H01L 21/304; B28D 1/005
See application file for complete search history.

(56) References Cited

U.S. PATENT DOCUMENTS 4,782,028 A 11/1988 Farrier et al.
4,939,568 A * 7/1990 Kato ................... H01L 21/6835
257/686
(Continued)

FOREIGN PATENT DOCUMENTS

EP 3171399 A1 * 5/2017 ............. H01L 21/78

*Primary Examiner* — Bitew A Dinke
(74) *Attorney, Agent, or Firm* — McDonnell Boehnen Hulbert & Berghoff LLP

(57) ABSTRACT

A sequential integration process is described. An example process involves forming a wafer stack by bonding a first wafer to a second wafer with a front side of the first wafer facing a front side of the second wafer, the first wafer including a first device region formed on the front side of the first wafer and including a set of semiconductor devices. The example process involves, subsequent to forming the wafer stack, forming a second device region on a back side of the first wafer, the second device region including a set of semiconductor devices. The example process involves forming at least one interconnection layer on the second device region for electrically interconnecting the semiconductor devices of the second device region. The example process also involves forming at least one via extending through the wafer stack from the at least one interconnection layer and through the first wafer.

12 Claims, 5 Drawing Sheets

(51) Int. Cl.
  *H01L 29/417* (2006.01)
  *H01L 31/0216* (2014.01)
  *H01L 21/8258* (2006.01)
  *B28D 1/00* (2006.01)
  *H01L 21/304* (2006.01)
  *H01L 31/0224* (2006.01)

(56) References Cited

U.S. PATENT DOCUMENTS

| | | | |
|---|---|---|---|
| 6,010,951 A | 1/2000 | Pushpala et al. | |
| 8,674,515 B2* | 3/2014 | Farooq | H01L 21/76898 257/257 |
| 8,753,913 B2* | 6/2014 | Or-Bach | H01L 31/0725 438/459 |
| 2007/0096263 A1* | 5/2007 | Furukawa | H01L 21/76898 257/621 |
| 2007/0145367 A1* | 6/2007 | Chen | H01L 21/6835 257/49 |
| 2007/0231950 A1* | 10/2007 | Pozder | H01L 21/76898 438/106 |
| 2007/0296073 A1* | 12/2007 | Wu | H01L 21/6835 257/686 |
| 2008/0142990 A1* | 6/2008 | Yu | H01L 21/8221 257/777 |
| 2009/0121260 A1* | 5/2009 | Bernstein | H01L 21/6835 257/255 |
| 2010/0264551 A1* | 10/2010 | Farooq | H01L 21/76898 257/777 |
| 2011/0143506 A1* | 6/2011 | Lee | H01L 23/481 438/238 |
| 2011/0168434 A1* | 7/2011 | Farooq | H01L 21/2007 174/257 |
| 2011/0193197 A1* | 8/2011 | Farooq | H01L 21/76898 257/618 |
| 2011/0193240 A1* | 8/2011 | Farooq | B32B 15/20 257/774 |
| 2011/0233702 A1* | 9/2011 | Takahashi | H01L 21/76898 257/432 |
| 2012/0241981 A1* | 9/2012 | Hirano | H01L 23/522 257/777 |
| 2012/0248544 A1* | 10/2012 | Yokoyama | H01L 21/84 257/369 |
| 2014/0094030 A1* | 4/2014 | Shimotsusa | H01L 21/768 438/652 |
| 2014/0232013 A1* | 8/2014 | Wu | H01L 21/76898 257/775 |
| 2014/0376291 A1 | 12/2014 | Blanchard et al. | |
| 2015/0235949 A1* | 8/2015 | Yu | H01L 23/3128 257/774 |
| 2015/0311142 A1* | 10/2015 | Sekar | H01L 23/3677 257/499 |
| 2015/0348945 A1* | 12/2015 | Or-Bach | H01L 21/743 257/384 |
| 2016/0049384 A1* | 2/2016 | Lu | H01L 21/76877 257/737 |
| 2016/0204154 A1* | 7/2016 | Chou | H01L 23/481 257/459 |
| 2017/0040296 A1* | 2/2017 | Das | H01L 23/481 |
| 2017/0162507 A1* | 6/2017 | Das | H01L 23/5383 |
| 2017/0194194 A1* | 7/2017 | Tsai | H01L 21/76251 |
| 2017/0200700 A1* | 7/2017 | Das | H01L 25/0657 |

* cited by examiner

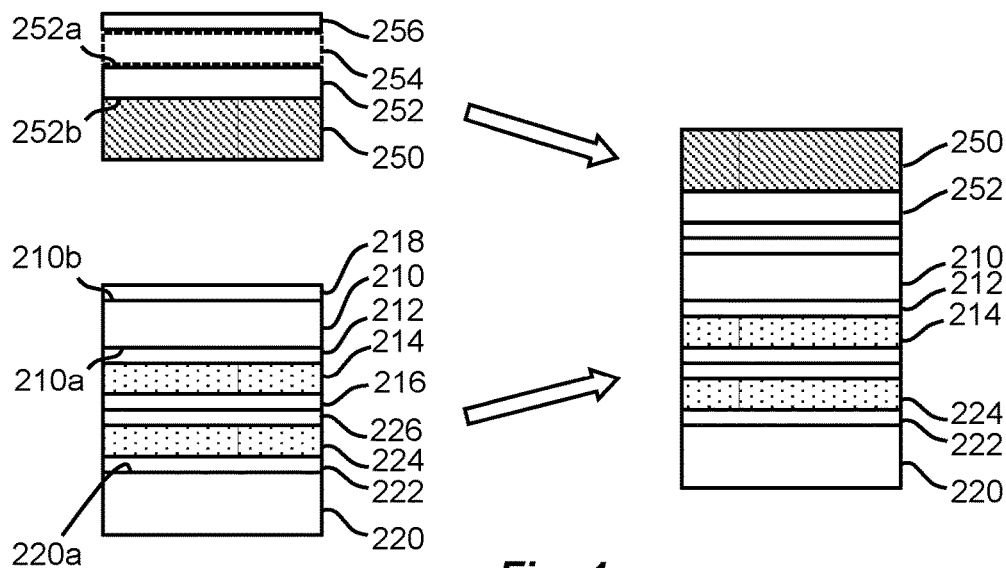
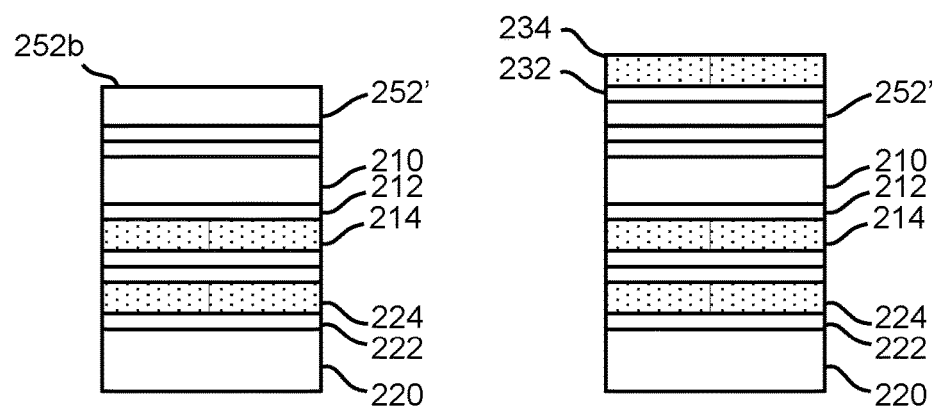
Fig. 4a
Fig. 4b
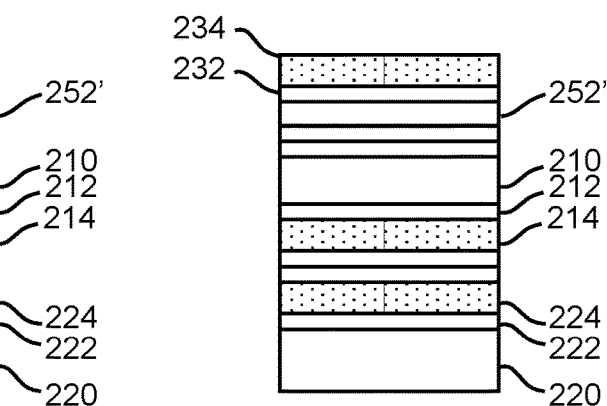
Fig. 4c
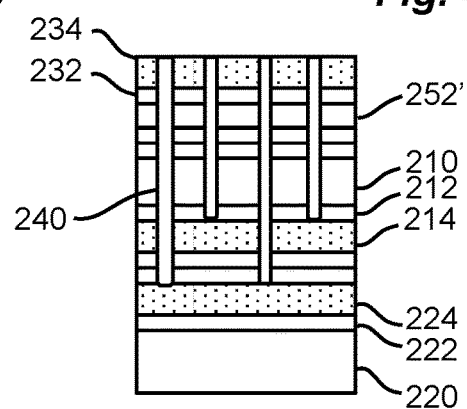
Fig. 4d

SEQUENTIAL INTEGRATION PROCESS

CROSS-REFERENCE TO RELATED APPLICATIONS

The present application is a non-provisional patent application claiming priority to EP Patent Application No. 16188504.1, filed Sep. 13, 2016, the contents of which are hereby incorporated by reference.

FIELD OF THE DISCLOSURE

The present disclosure relates to a sequential integration process.

BACKGROUND

A conventional 3D integration process, also known as chip-stacking, involves stacking and bonding of two or more processed wafers on top of each other and interconnecting the devices of the processed wafers by vias. An existing 3D integration process is schematically illustrated in FIG. 1 wherein three processed wafers 10, 20 and 30, each having a semiconductor device region 12, 22, 32 and an interconnection layer 14, 24, 34, are stacked and bonded to each other via an oxide or nitride bonding layer 16, 26, 36. Different levels of the stack may be connected by vias.

In a sequential or monolithic 3D integration process, the device processing is instead done subsequent to the wafer bonding. An existing sequential 3D integration process is schematically illustrated in FIG. 2 wherein a semiconductor substrate 50 is transferred on top of a wafer 40 having a semiconductor device region 42, an interconnection layer 44, and a bonding layer 46. Processing for forming a semiconductor device region 52 on the front side of the semiconductor substrate 50 is then performed. An interconnection layer 54 may be formed on the semiconductor device region 52. Different levels of the stack may be connected by vias.

3D integration processes allow forming of area efficient chips or integrated circuits. The sequential 3D integration process provides the additional benefit over the conventional integration process of enabling reduced device layer spacing and via height compared to the chip-stacking technique since the wafer 40 supports the substrate 50 during the device processing on the substrate 50 and hence reduces the number of wafers needed. However there is still a need for further improvements in area efficiency.

SUMMARY

An objective of the present disclosure is to provide a sequential integration process enabling a further improvement in area efficiency of manufactured circuits compared to the existing integration processes. Additional or alternative objectives may be understood from the following.

According to an aspect of the present disclosure there is provided a sequential integration process comprising:

forming a wafer stack by bonding a first wafer to a second wafer with a front side of the first wafer facing a front side of the second wafer, the first wafer including a first device region formed on the front side of the first wafer and including a set of semiconductor devices;

subsequent to forming the wafer stack, forming a second device region on a back side of the first wafer, the second device region including a set of semiconductor devices;

forming at least one interconnection layer on the second device region for electrically interconnecting the semiconductor devices of the second device region; and forming at least one via extending through the wafer stack from the at least one interconnection layer and through the first wafer.

By the disclosed process, an additional wafer surface, namely the backside of the first wafer, is made available for device integration. Accordingly a vertical wafer stack including a first wafer with both front and back side device regions may be formed. For a same number of wafers, this enables manufacturing of circuits of an improved area efficiency compared to the existing processes.

Since the second device region is formed after bonding of the first and the second wafer, the disclosed process may be referred to as a "sequential" integration process.

As used herein, a "front side" and a "back side" of a wafer means opposite sides of the wafer, or in other words the sides formed by mutually opposite first and second main surfaces of the wafer.

Forming or bonding a region/layer "on", or a region/layer being formed or bonded "to", a front/back side of a wafer may accordingly herein be understood as forming the region/layer, or the region/layer being formed or bonded, directly on the front/back side surface of the wafer (i.e. without any intermediate layers) or on the front/back side surface of the wafer with one or more intermediate layers between the front/back side surface of the wafer and the region/layer formed (i.e. the region/layer formed "at" the front/back side surface of the wafer).

By a "device region" (e.g. the first or the second device region) is herein meant a region having a lateral or horizontal extension on a wafer or substrate side. A device region may also be referred to as an active device region. A device region of a wafer or substrate may form a front end of line (FEOL) device region of the wafer or substrate. A device region may include a set of planar or non-planar semiconductor devices, or a combination thereof.

A thickness portion of a wafer or substrate, in which a device region is formed, may be referred to as a device layer, an active device layer, or a FEOL (device) layer of the wafer/substrate.

Dielectric regions may be formed in a semiconductor wafer or semiconductor substrate for device isolation. Dielectric regions may be formed by shallow-trench isolation (STI) regions. Dielectric regions may be formed before a device region has been formed, after a device region has been formed, or between device region processing steps.

The first device region may be formed by processing the front side of the first wafer to form the semiconductor devices in semiconductor material of the front side of the first wafer.

The second device region may be formed by processing the back side of the first wafer to form the semiconductor devices in semiconductor material of the back side of the first wafer. Alternatively, the second device region may be formed by processing a semiconductor layer bonded to the back side of the first wafer to form the semiconductor devices in the semiconductor layer.

The first device region and the second device region may include devices of different types. Devices may be formed of different semiconductor materials, include different combinations of dopants, and/or include different dopant concentrations.

By at least one "interconnection layer" is herein meant one or more dielectric layers including conducting patterns or paths. A plurality of interconnection layers may be present including a plurality of interconnection levels (formed by conducting patterned layers) separated by inter-level dielectrics. Conductive paths of both inter- and intra-layer extension may be present. The conducting paths may electrically interconnect the semiconductor devices of a device region and optionally also interconnect contact regions (e.g. source, drain or gate) of individual semiconductor devices. The at least one interconnection layer may form middle end of line (MOL) and/or back end of line (BEOL) layers.

By at least one "via" is herein meant at least one electrical connection extending in a vertical direction through the wafer stack.

One or more of the vias may extend completely or at least partially through the first wafer.

One or more of the vias may extend through a semiconductor portion of the first wafer and/or a dielectric/STI region of the first wafer (if such are present).

One or more of the vias may form "inter-tier" vias. That is, the vias may interconnect device regions and/or interconnection layers at different "tiers" or "levels" of the wafer stack.

One or more of the vias may form through substrate vias or through silicon vias (TSVs) with respect to at least the first wafer of the stack.

One or more of the vias may extend from the at least one interconnection layer and at least to the first device region.

One or more of the vias may electrically connect the at least one interconnection layer to one or more of the first device region and the second device region.

Bonding of the first wafer to the second wafer (also generally applicable to any herein described bonding of a wafer, substrate or layer to another wafer, substrate or layer) may include bonding the first wafer and the second wafer via an intermediate bonding layer. A bonding layer may be formed on one or more of the wafer sides facing each other. A bonding layer may be an oxide layer wherein the wafers may be bonded by oxide-oxide bonding. A bonding layer may be a nitride layer wherein the wafers may be bonded by nitride-nitride bonding. Electrical insulation between wafers may thereby be achieved.

According to an example embodiment, the method further comprises bonding a semiconductor layer to the back side of the first wafer with a front side of the semiconductor layer facing the back side of the first wafer, wherein the forming of the second device region includes forming the second device region on a back side of the semiconductor layer.

The second device region may accordingly be formed on the backside of the first wafer with at least a thickness portion of a semiconductor layer intermediate the first wafer and the second device region.

By forming the second device region on the backside of a semiconductor layer, hetero-integration is enabled, i.e. integration of different material systems in the wafer stack.

The at least one interconnection layer formed on the second device region of the semiconductor layer may form MOL and/or BEOL layers of the semiconductor layer, i.e. with respect to the second device region.

One or more of the vias may extend from the at least one interconnection layer, through the semiconductor layer and the first wafer. One or more of the vias may extend to the first device region of the first wafer and optionally also to an interconnection layer formed on the first device region of the first wafer (e.g., if such a layer is present).

One or more of the vias may electrically connect the at least one interconnection layer formed on the second device region to one of more of the first device region, an interconnection layer formed on the first device region, and the second device region.

The semiconductor material forming the semiconductor devices of the second device region may be different from a semiconductor material forming the semiconductor devices of the first device region. In an example embodiment, the first device region includes Si semiconductor devices and the second device region includes Ge or group III-V semiconductor material devices, or vice versa.

Different device technology may be implemented in the first device region and the second device region, for instance a combination of analog devices and digital devices, combinations of I/O devices, radio frequency (RF) devices and/or ESD devices (i.e. devices for protection from electrostatic discharge). It is also possible to form planar transistors in one of the device regions and non-planar transistors (e.g. FinFETs or nanowire transistors) in the other device region. It is also possible to form devices in the device regions using different process technology nodes, for instance the N45 node in one of the device regions and the N14 node in the other device region. Using slower nodes for implementing devices/circuitry for slower applications may reduce overall costs.

The semiconductor layer (which also may be referred to as a semiconductor substrate) may be formed on a bottom substrate. Subsequent to the bonding of the semiconductor layer to the first wafer, the bottom substrate may be removed from the semiconductor layer to expose the back side of the semiconductor layer and thereafter the second device region may be formed on the back side of the semiconductor layer. The bottom substrate may thereby function as a handling or donor wafer for the semiconductor layer and thus facilitate transfer of a comparably thin semiconductor layer to the wafer stack.

The act of forming the semiconductor layer on the bottom substrate may form part of the disclosed process, or a semiconductor layer may be formed on a bottom substrate in a process separate from the disclosed process and provided as pre-made component to the disclosed process.

Subsequent to removing the bottom substrate, and prior to forming the second device region, thinning of the semiconductor layer may be performed.

By thinning the semiconductor substrate prior to forming of the second device region, the height of the final stack may be reduced and any defective portions of the semiconductor layer may be removed. Also, an appropriate layer thickness for the intended device type may be obtained.

The bottom substrate may include a Si-layer and the semiconductor layer may be formed by a group IV material layer. The group IV material layer may be formed by Ge, SiGe, SiC, or GeSn. A group IV material layer (i.e. other than Si) may be grown on the Si bottom substrate with or without an intermediate strain relaxed buffer (SRB).

The bottom substrate may include a Si-layer and the semiconductor layer may be formed by a group III-V material layer or by a stack including a group III-V material layer formed on a Ge-layer.

The group III-V material layer may be formed by AlAs, GaN, AlGaN, InN, AlN, GaP, GaAs, InP, InAs, InGaAs, InAlAs, InGaP, InSb, AlSb or InGaSb.

A Ge-layer may be grown on a Si bottom substrate with or without an intermediate SRB. A group III-V material layer may be grown on a Ge-layer with or without an intermediate SRB.

A group III-V material layer enables forming of semiconductor devices with increased cut-off frequency compared to group IV materials. A group III-V material layer thus lends itself favorably to supporting a device region implementing RF devices. A group III-V material layer also offers improved electron mobility compared to group IV materials. A group III-V material layer thus lends itself favorably also to supporting a device region implementing NMOS devices.

Forming the semiconductor layer as a stack of a Ge-layer and a group III-V material layer enables device regions including Ge- and group III-V semiconductor devices to be formed on opposite sides of the semiconductor layer. The device region on the Ge-layer may include PMOS devices (Ge presents hole mobility). The device region on the group III-V material layer may include NMOS devices (III-V materials present electron mobility).

In addition to the second device region, a third device region including a set of semiconductor devices may be formed on the front side of the semiconductor layer. The third device region may be formed prior to the bonding of the semiconductor layer to the first wafer.

The act of forming the third device region may form part of the disclosed process, or a third device region may be formed on the front side of the semiconductor layer in a process separate from the disclosed process wherein a semiconductor substrate with a front side device region may be provided as a pre-made component to the process.

The second and the third device region may form two mutually opposite FEOL device regions/layers of the semiconductor layer.

The third device region may include a set of planar or non-planar semiconductor devices, or a combination thereof.

The second device region and the third device region may include devices of different types. Devices may include different combinations of dopants, and/or include different dopant concentrations. The devices may be formed using different process technology nodes.

At least one interconnection layer may be formed on the third device region for electrically interconnecting the semiconductor devices of the third device region.

The at least one interconnection layer may form MOL and/or BEOL layers of the semiconductor substrate, i.e. with respect to the third device region.

The act of forming the at least one interconnection layer on the third device region may form part of the disclosed process, or at least one interconnection layer may be formed on the third device region of the semiconductor layer in a process separate from the disclosed process wherein a semiconductor substrate with a front side device region and an interconnection layer may be provided as a pre-made component to the disclosed process.

According to embodiments where the second device region is formed on the back side of the semiconductor layer, the first wafer may be formed of a semiconductor material, for instance Si, Ge, SiGe, SiC, GaAs or InP. The first wafer may also be a SOI wafer, a GeOI wafer, SiGeOI wafer or a III-V-OI wafer. The second wafer may be formed of a semiconductor material, for instance Si, Ge, SiGe, SiC, GaAs, or InP. The second wafer may also be a SOI wafer, a GeOI wafer, SiGeOI wafer, or a III-V-OI wafer. The second wafer may also be formed of a non-semiconductor material such as a dielectric material, and in an example embodiment a glass material.

According to embodiments where the second wafer is formed of a semiconductor material, a device region including a set of semiconductor devices may be formed on the front side of the second wafer. It is hence possible to obtain a wafer stack wherein as many as four different device regions are formed on different levels of the stack of the second wafer/first wafer/semiconductor substrate, i.e. on the front side of the second wafer, on the front side of the first wafer, on the front side of the semiconductor layer, and on the backside of the semiconductor layer.

At least one interconnection layer may be formed on the device region of the second wafer for electrically interconnecting the semiconductor devices of the device region of the second wafer. The forming of the at least one interconnection layer may be performed prior to the bonding of the first wafer to the second wafer.

The at least one interconnection layer may form MOL and/or BEOL layers of the second wafer, i.e. with respect to the device region formed on the second wafer.

The act of forming a device region on the front side of the second wafer and/or the act of forming the at least one interconnection layer on the device region of the second wafer may form part of the disclosed process, or a device region and/or at least one interconnection layer may be formed on the second wafer in a process separate from the disclosed process wherein a second wafer with a front side device region and optionally also an interconnection layer may be provided as a pre-made component to the process.

One or more of the vias may extend from the at least one interconnection layer formed on the second device region, through the semiconductor layer, the first wafer and to the device region of the second wafer or at least to an interconnection layer formed on the device region of the second wafer (e.g., if such a layer is present).

One or more of the vias may electrically connect the at least one interconnection layer formed on the second device region to one of more of the first device region, an interconnection layer formed on the first device region, the second device region, the device region formed on the second wafer, and an interconnection layer formed on the device region of the second wafer (e.g., if such a layer is present).

According to embodiments where the second wafer is formed of a non-semiconductor material, the second wafer may serve as a handling wafer and facilitate handling of the wafer stack during the process. The second wafer may be removed or thinned subsequent to forming of the interconnection layer on the second device region of the semiconductor layer. Removing or thinning of the second wafer may include grinding, CMP and/or etch back from the backside of the second wafer.

According to an example embodiment, the first wafer includes a semiconductor layer, wherein the first device region is formed on a front side of the semiconductor layer and bonding the first wafer to the second wafer includes bonding the front side of the semiconductor layer to the second wafer, and the method further comprises, subsequent to the bonding to the second wafer, forming the second device region on a back side of the semiconductor layer.

The second device region may accordingly be formed directly on the backside of the first wafer, the backside being formed by the semiconductor layer.

By forming the second device region on the backside of a semiconductor layer, hetero-integration is enabled, i.e. integration of different material systems in the stack.

The first and the second device region may form two mutually opposite FEOL device regions/layers of the semiconductor layer.

At least one interconnection layer may be formed on the first device region for electrically interconnecting the semiconductor devices of the first device region.

The at least one interconnection layer may form MOL and/or BEOL layers of the semiconductor layer, i.e. with respect to the first device region.

The act of forming the at least one interconnection layer on the first device region may form part of the disclosed process, or at least one interconnection layer may be formed on the first device region of the semiconductor layer in a process separate from the disclosed process wherein a first wafer with a front side device region and an interconnection layer may be provided as a pre-made component to the process.

According to embodiments where the second device region is formed on the back side of the semiconductor layer of the first wafer, the second wafer may be formed of a semiconductor material, for instance Si, Ge, SiGe, SiC, GaAs, or InP. The second wafer may also be a SOI wafer, a GeOI wafer, SiGeOI wafer, or a III-V-OI wafer. The second wafer may also be formed of a non-semiconductor material such as a dielectric material (e.g., a glass material).

According to embodiments where the second wafer is formed of a semiconductor material, a device region including a set of semiconductor devices may be formed on the front side of the second wafer.

It is hence possible to obtain a wafer stack wherein as many as three different device regions are formed on different levels of the stack of the second wafer/first wafer, i.e. on the front side of the second wafer, on the front side of the semiconductor layer, and on the backside of the semiconductor layer.

The device region of the second wafer may include a set of planar or non-planar semiconductor devices, or a combination thereof.

The device region of the second wafer may include devices of types different from the first and second device regions of the semiconductor layer. Devices may be formed of different semiconductor materials, include different combinations of dopants, and/or include different dopant concentrations. The devices may be formed using different process technology nodes.

At least one interconnection layer may be formed on the device region of the second wafer for electrically interconnecting the semiconductor devices of the device region of the second wafer. The forming of the at least one interconnection layer may be performed prior to the bonding of the first wafer to the second wafer.

The at least one interconnection layer may form MOL and/or BEOL layers of the second wafer, i.e. with respect to the device region formed on the second wafer.

The act of forming a device region on the front side of the second wafer and/or the act of forming the at least one interconnection layer on the device region of the second wafer may form part of the disclosed process, or a device region and/or at least one interconnection layer may be formed on the second wafer in a process separate from the disclosed process wherein a second wafer with a front side device region and optionally also an interconnection layer may be provided as a pre-made component to the process.

The semiconductor material forming the semiconductor devices of the first and the second device region of the first wafer may be formed by a semiconductor material which is different from a semiconductor material forming the semiconductor devices of the device region of the second wafer. Accordingly different device technology may be implemented in the first/second device region of the semiconductor layer/first wafer and the device region of the second wafer, for instance a combination of analog devices and digital devices, combinations of I/O devices, RF devices and/or ESD devices. It is also possible to form planar transistors in at least one of the device regions and non-planar transistors (e.g. FinFETs or nanowire transistors) in at least one of the other device region(s). It is also possible to form devices in the device regions using different process technology nodes, for instance the N45 node in at least one of the device regions and the N14 node in at least one of the other device region(s). Using slower nodes for implementing devices/circuitry for slower applications may reduce overall costs.

The first wafer may further include a bottom substrate, the back side of the semiconductor layer facing the bottom substrate, wherein the method may further comprise, subsequent to the bonding to the second wafer, removing the bottom substrate from the semiconductor layer to expose the back side of the semiconductor layer and thereafter forming the second device region on the back side of the semiconductor layer.

The bottom substrate may include a Si-layer and the semiconductor layer may be formed by a group IV material layer. The group IV material layer may be formed by Ge, SiGe, SiC, or GeSn. A group IV material layer (i.e. other than Si) may be grown on the Si bottom substrate with or without an intermediate SRB.

The bottom substrate may include a Si-layer and the semiconductor layer may be formed by a group III-V material layer or by a stack including a group III-V material layer formed on a Ge-layer.

The group III-V material layer may be formed by AlAs, GaN, AlGaN, InN, AlN, GaP, GaAs, InP, InAs, InGaAs, InAlAs, InGaP, InSb, AlSb or InGaSb.

A Ge-layer may be grown on a Si bottom substrate with or without an intermediate SRB. A group III-V material layer may be grown on a Ge-layer with or without an intermediate SRB.

A group III-V material layer enables forming of semiconductor devices with increased cut-off frequency compared to group IV materials. A group III-V material layer thus lends itself favorably to supporting a device region implementing RF devices. A group III-V material layer also offers improved electron mobility compared to group IV materials. A group III-V material layer thus lends itself favorably also to supporting a device region implementing NMOS devices.

Forming the semiconductor layer as a stack of a Ge-layer and a group III-V material layer enables device regions including Ge- and group III-V semiconductor devices to be formed on opposite sides of the semiconductor layer. The device region on the Ge-layer may include PMOS devices (Ge presents hole mobility). The device region on the group III-V material layer may include NMOS devices (III-V materials present electron mobility).

One or more of the vias may extend from the at least one interconnection layer formed on the second device region, through the semiconductor layer of the first wafer, and to the device region of the second wafer or at least to an interconnection layer formed on the device region of the second wafer (e.g., if such a layer is present).

One or more of the vias may electrically connect the at least one interconnection layer formed on the second device region to one or more of the first device region, an interconnection layer formed on the first device region, the second device region, the device region formed on the second wafer, and an interconnection layer formed on the device region of the second wafer (e.g., if such a layer is present).

According to an example embodiment, the forming of the second device region includes forming the second device region directly on the back side of the first wafer. Hence no separate dedicated handling wafer for supporting a layer/substrate implementing the second device region is required.

This embodiment lends itself for homo-integration since a same wafer, i.e. the first wafer, implements both the first and the second device region.

The first and the second device region may form two mutually opposite FEOL device regions/layers of the first wafer.

Subsequent to bonding the first wafer to the second wafer, and prior to forming the second device region, thinning of the first wafer may be performed, wherein the second device region may be formed on the back side of the thinned first wafer. Thinning of the first wafer may include performing a CMP on the backside of the first wafer. By thinning the semiconductor substrate prior to forming of the second device region, the height of the final stack may be reduced and any defective portions of the semiconductor layer may be removed.

The first wafer may be formed of a semiconductor material, for instance Si, Ge, SiGe, SiC, GaAs, or InP. The first wafer may also be a SOI wafer, a GeOI wafer, SiGeOI wafer or a III-V-OI wafer. The second wafer may be formed of a semiconductor material, for instance Si, Ge, SiGe, SiC, GaAs, or InP. The second wafer may also be a SOI wafer, a GeOI wafer, SiGeOI wafer, or a III-V-OI wafer. The second wafer may also be formed of a non-semiconductor material such as a dielectric material (e.g., a glass material).

According to embodiments where the second wafer is formed of a semiconductor material, a device region including a set of semiconductor devices may be formed on the front side of the second wafer.

It is hence possible to obtain a wafer stack wherein as many as three different device regions are formed on different levels of the stack of the second wafer/first wafer, i.e. on the front side of the second wafer, on the front side of the first wafer, and on the backside of the first wafer.

The device region of the second wafer may include a set of planar or non-planar semiconductor devices, or a combination thereof.

The device region of the second wafer may include devices of types different from the first and second device regions of the semiconductor layer. Devices may be formed of different semiconductor materials, include different combinations of dopants, and/or include different dopant concentrations. The devices may be formed using different process technology nodes.

At least one interconnection layer may be formed on the device region of the second wafer for electrically interconnecting the semiconductor devices of the device region of the second wafer. The forming of the at least one interconnection layer may be performed prior to the bonding of the first wafer to the second wafer.

The at least one interconnection layer may form MOL and/or BEOL layers of the second wafer, i.e. with respect to the device region formed on the second wafer.

The act of forming a device region on the front side of the second wafer and/or the act of forming the at least one interconnection layer on the device region of the second wafer may form part of the disclosed process, or a device region and/or at least one interconnection layer may be formed on the second wafer in a process separate from the disclosed process wherein a second wafer with a front side device region and optionally also an interconnection layer may be provided as a pre-made component to the process.

The semiconductor material forming the semiconductor devices of the first and the second device region of the first wafer may be formed by a semiconductor material which is different from a semiconductor material forming the semiconductor devices of the device region of the second wafer. Accordingly, different device technology may be implemented in the first/second device region of the first wafer and the device region of the second wafer, for instance a combination of analog devices and digital devices, combinations of I/O devices, RF devices and/or ESD devices. It is also possible to form planar transistors in at least one of the device regions and non-planar transistors (e.g. FinFETs or nanowire transistors) in at least one of the other device region(s). It is also possible to form devices in the device regions using different process technology nodes, for instance the N45 node in at least one of the device regions and the N14 node in at least one of the other device region(s). Using slower nodes for implementing devices/circuitry for slower applications may reduce overall costs.

One or more of the vias may extend from the at least one interconnection layer formed on the second device region, through the first wafer, and to the device region of the second wafer or at least to an interconnection layer formed on the device region of the second wafer (e.g., if such a layer is present).

One or more of the vias may electrically connect the at least one interconnection layer formed on the second device region to one of more of the first device region, an interconnection layer formed on the first device region, the second device region, the device region formed on the second wafer, and an interconnection layer formed on the device region of the second wafer.

According to another aspect there is provided a wafer stack including a first wafer and a second wafer, the first wafer being bonded to the second wafer with a front side of the first wafer facing a front side of the second wafer, wherein the first wafer includes:

a first device region formed on the front side of the first wafer and including a set of semiconductor devices, a second device region formed on a back side of the first wafer and including a set of semiconductor devices, and at least one interconnection layer arranged on the second device region for electrically interconnecting the semiconductor devices of the second device region, the wafer stack further including at least one via extending through the wafer stack from the at least one interconnection layer and through the first wafer.

The various example embodiments and variations of the wafer stack, as well as details thereof, discussed in the above apply corresponding to the wafer stack aspect. Reference is therefore made to the above discussion.

BRIEF DESCRIPTION OF THE FIGURES

The above, as well as additional, features will be better understood through the following illustrative and non-limiting detailed description of example embodiments, with reference to the appended drawings. In the drawings like reference numerals will be used for like elements unless stated otherwise.

FIGS. 4a, 4b, 4c, and 4d are schematic illustrations of a sequential integration process, according to an example embodiment.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A number of example sequential integration processes will now be described with reference to FIGS. 3a-c, 4a-d, and 5a-d. In the figures, various wafer stacks are schematically shown in a cross-section taken vertically through the stacks. Only portions of the layers forming part of the stacks are shown and the layers may extend laterally/horizontally beyond the illustrated portions. It should also be noted that for the purpose of clarity the various layers and other features of the stacks are not drawn to scale and their relative dimensions, in particular their thickness, may differ from a physical stack.

Figure 1:
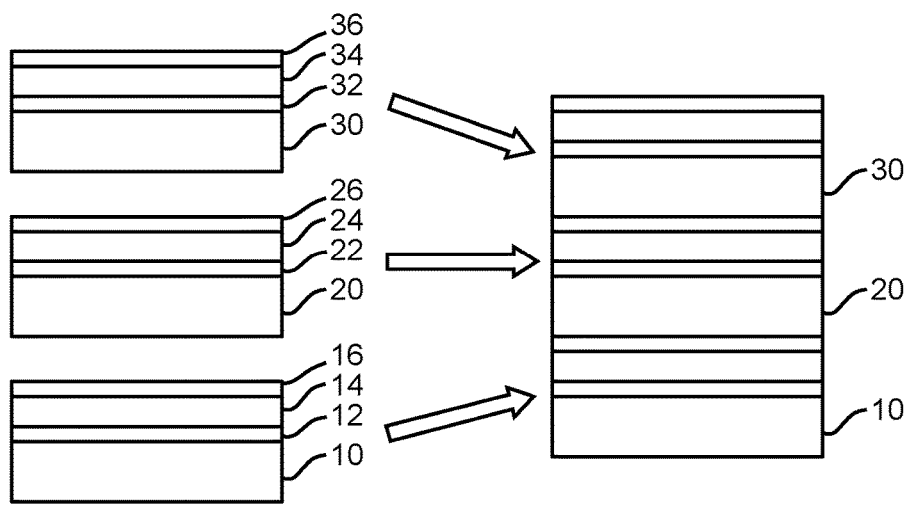
FIG. 1 is a schematic illustration of an existing 3D integration process.
Figure 2:
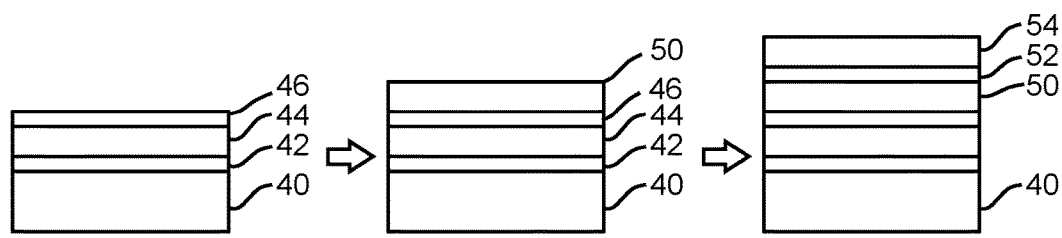
FIG. 2 is a schematic illustration of an existing 3D integration process.
Figure 3A:
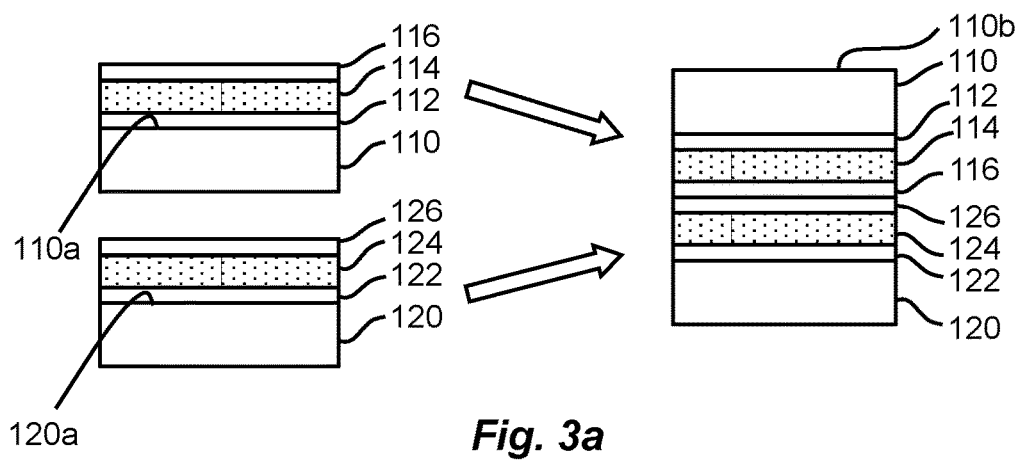
FIGS. 3a, 3b, and 3c, are schematic illustrations of a sequential integration process, according to an example embodiment.
Figure 3B:
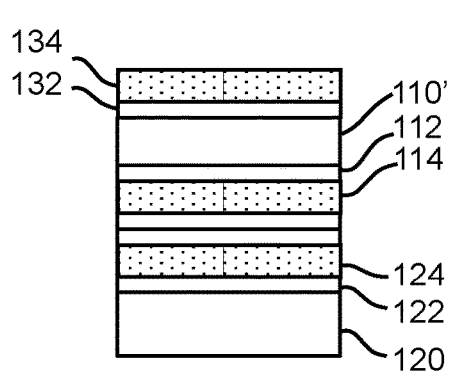
Figure 3C:
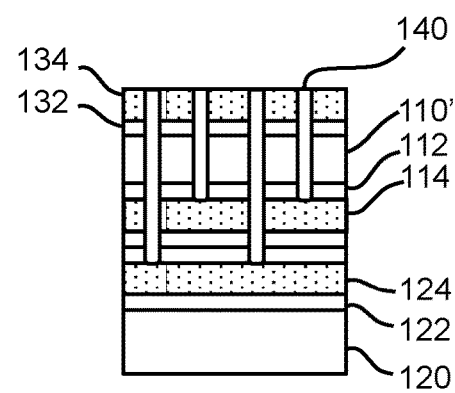

FIG. 3a through 3c illustrate an example sequential integration process which is particularly suitable for a homo-integration approach.

FIG. 3a shows a first wafer 110. The first wafer 110 may be of a semiconductor material such as Si, Ge, SiGe, SiC, GaAs or InP. The first wafer 110 may also be a SOI wafer, a GeOI wafer, SiGeOI wafer or a III-V-OI wafer. A first device region 112 is formed on a front side 110a of the first wafer 110. At least one interconnection layer 114 is formed on the first device region 112. A bonding layer 116 is formed on the interconnection layer 114.

Figure 6:
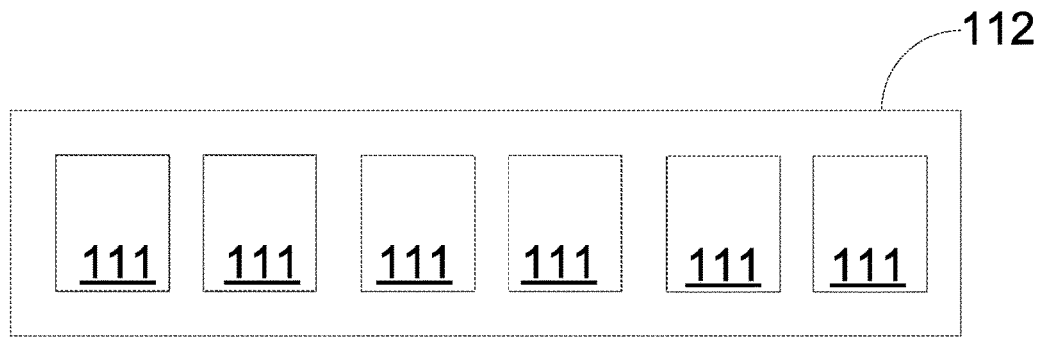
FIG. 6 is a schematic diagram of a device region, according to an example embodiment.

The first device region 112 includes a set of semiconductor devices and defines a first FEOL layer of the first wafer 110. The set of semiconductor devices may include planar or non-planar devices. By way of example, the set of semiconductor devices may include metal-oxide-semiconductor field-effect transistors (MOSFETs), metal-insulator-semiconductor field-effect transistors (MISFETs), bipolar transistors (BJTs), heterojunction BJTs (HBTs), fin field-effect transistors (FinFETs), nanowire FETs, high electron mobility transistors (HEMT), junction less transistor (JLT), and/or tunnel Field effect transistor (TFET). The semiconductor devices may be formed using conventional device fabrication/FEOL processing in accordance with the particular type of devices. As such, the first device region 112 can include a first set of transistors 111, as shown in FIG. 6.

Although in the drawings the device regions are generally illustrated as layers, it is noted that a device region typically may present a limited horizontal extension on a wafer side. Semiconductor devices need hence not be present throughout the layers indicated in the drawings. However, the designation "device/FEOL layer" may be understood to refer to a thickness portion of a wafer/substrate in or on which a device region (for instance the first device region 112) is formed.

By way of example, FEOL processing for forming a set of planar FETs may include a number of different processing stages or module including for instance forming of device isolation using the shallow trench isolation (STI) technique on the front side of the first wafer 110. Forming of STI regions may be followed by formation of the gate, which could be formed by either a gate first or a gate last process (also known as replacement metal gate process). In a gate first process, the gate dielectric and the gate conductor are formed prior to forming of source and drain regions. In a gate last process, the final gate dielectric and gate conductor are formed after forming of source and drain regions. In an example gate last process, a dummy gate oxide and a dummy gate (e.g. of amorphous/poly Si) may be deposited and patterned. Source and drain region may then be formed by implantation and subsequent annealing or by in-situ epitaxial growth of a doped semiconductor layer. An inter-layer dielectric (ILD) deposition may thereafter be performed. Following CMP of the ILD, the dummy gate and dummy gate oxide may be removed to create a trench in the ILD. A gate dielectric and a gate conductor may be deposited to fill the trench. Portions of the gate conductor deposited outside the trench may be removed by CMP. Contact windows may be opened above the source and drain regions and filled with metal. In the gate last process, spacers may be formed on the dummy gate or the final gate by spacer material deposition.

The above discussion concerning the first device region 112 and the FEOL processing is applicable also to the further device regions discussed below. The discussion will therefore not be repeated in connection with the further device regions.

The at least one interconnection layer 114 is formed on the first device region 112 for interconnecting the semiconductor devices of the first device region 112. The at least one interconnection layer 114 forms a BEOL layer with respect to the first device region 112. The at least one interconnection layer 114 may include a plurality of dielectric layers including conductive paths. The conductive paths may be formed by a conductive material, for instance metallic conductors such as Cu, W, Au, Ag, Al, Co or Ru. The dielectric layers may be formed for instance by silicon oxide, silicon oxide nitride, silicon carbide nitride or silicon nitride.

Also shown in FIG. 3a is a second wafer 120. Similar to the first wafer 110, a device region 122, an interconnection layer 124, and a bonding layer 126 is formed on a front side 120a of the second wafer 120. The first wafer 120 and the second wafer 120 may be formed of a material of a same or a different type. The device region 122 and the interconnection layer 124 may be formed to implement desired type(s) of devices and circuitry.

At the right-hand side of FIG. 3a is shown a wafer stack formed by bonding the first wafer 110 to the second wafer 120 with the front side 110a of the first wafer 110 facing the front side 120a of the second wafer 120. As seen in FIG. 3a, a back side 110b of the first wafer 110 thereby forms a front side of the wafer stack.

The bonding is achieved by the bonding layers 116, 126. The bonding layers 116, 126 may be oxide or nitride layers, wherein the wafers 110, 120 may be bonded by oxide-oxide or nitride-nitride bonding. More generally, the bonding may be achieved by molecular bonding. The bonding layers may also be adhesive layers, wherein the wafers 110, 120 may be glued together (adhesive bonding). The bonding layers 116, 126 may be metallic bonding layers (such as Au or Ag), wherein the wafers 110, 120 may be bonded by thermocompression.

Figure 7:
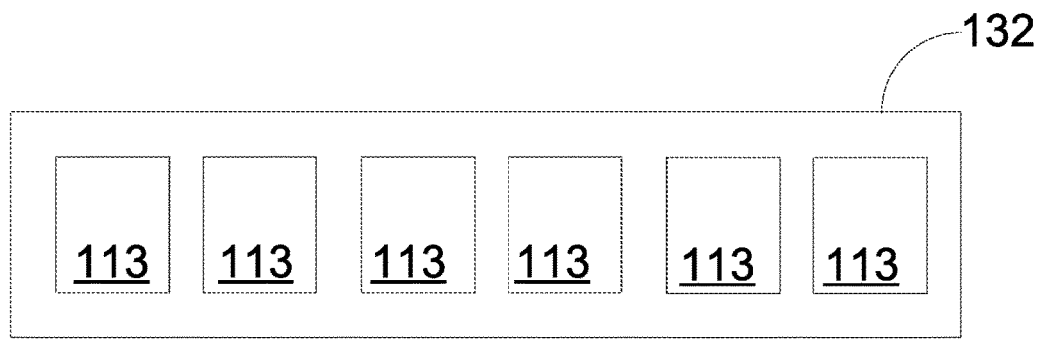
FIG. 7 is a schematic diagram of a device region, according to an example embodiment.

In FIG. 3b, a second device region 132 is formed on the back side 110b of the first wafer 110. The second device region 132 includes a set of semiconductor devices and defines a second FEOL layer of the first wafer 110. At least one interconnection layer 134 is formed on the second device region 132. The at least one interconnection layer 134 forms a BEOL layer with respect to the second device region 132. As such, the second device region 132 can include a second set of transistors 113 as shown in FIG. 7.

The second device region 132 and the at least one interconnection layer 134 may be implemented in a similar manner as outlined in connection with the first device region 112 and the at least one interconnection layer 114, respectively. However it should be noted that, in an example embodiment, all FEOL processing steps to form the second device region 132, as well as BEOL processing steps to form the at least one interconnection layer 134, are performed at temperatures below 600° C. or in an example embodiment below 500° C. to avoid affecting BEOL layers and other FEOL layers already present in the wafer stack. More generally, the limit on temperature could vary depending upon metal and type of inter metal dielectric used in the BEOL layer and time for which the wafer stack is subjected to these temperature.

As shown in FIG. 3b, prior to forming the second device region 132, an optional thinning of the first wafer 110 may be performed. The thinning may include grinding and/or (selective) etch back from the back side 110b of the first wafer 110, optionally followed by CMP. The second device region 132 may thereafter be formed on the thinned wafer 110'.

In FIG. 3c a number of vias 140 is formed to extend through the wafer stack. Although FIG. 3c shows four vias 140, this represents an example and the number of vias 140 may be implementation specific. By way of example, two vias extend from the at least one interconnection layer 134, through the first wafer 110', the at least one interconnection layer 114, and the bonding layers to the at least one interconnection layer 124. The two vias may accordingly electrically interconnect the at least one interconnection layers 134, 114 and 124 and the device regions 132, 112 and 122. The two other vias extend from the at least one interconnection layer 134, through first wafer 110' to the at least one interconnection layer 114. The other two vias may accordingly electrically interconnect the at least one interconnection layers 134 and 114 and the device regions 132 and 112.

The vias 140 may be formed by a conductive material, for instance metallic conductors such as Cu, W, Au, Ag, Al, Co, Ni, Ru or by highly doped semiconductor material. The vias 140 may further include a liner material formed by a dielectric material, such as a silicon oxide or silicon nitride. Vias formed by conductive material and dielectric liner may be referred to as TSVs or vias that extend through semiconductor material regions. Vias extending only through dielectric material, such as STI regions, need not be formed with a dielectric liner and may be referred to as inter-tier vias.

The vias 140 may be formed in a conventional manner, by forming a respective trench through the wafer stack at the intended positions of the vias 140 to be formed. An etch mask (not shown) may be formed above the at least one interconnection layer 134 with openings defining the positions of the trenches. The mask may be patterned using lithography and etching. The trenches may be formed by anisotropic etching through the mask openings. The etching may be continued until trenches with a desired depth have been formed, typically at a depth corresponding to one of the interconnection layers 114 or 124. A via liner material may be deposited in the trenches and subsequently a conductive material may be deposited in the trenches. The liner may function as an insulator to prevent a short between the conductive material and semiconductor layer or it could function as a diffusion barrier along sections not extending through semiconductor material. The mask may be stripped and any material deposited outside the trenches may be removed by CMP. Masking material as well as lithography and etching technique may be selected in accordance with the material systems and device implementation of the first wafer 110. If vias 140 of different materials or dimensions (e.g. height or depth) are to be formed, the forming the vias 140 may be formed by repeating the above process steps a number of times to form each desired via structure.

Following forming of the structure shown in FIG. 3c, further back end or packaging processing may be performed in a conventional manner, including for instance forming of contact pads above the at least one interconnection layer 134 to provide a contact interface towards the vias 140.

In an example variation of the process described with reference to FIG. 3a-c, in an example embodiment the at least one interconnection layer 114 may not be present on the first device region 112. Furthermore, in an example embodiment, the device region 122 and/or the at least one interconnection layer 124 may not be present on the second wafer 120. Hence, in a basic variation of the above-described process, device regions may be formed only on the front side 110a and the back side 110b of the first wafer 110/110'. In that case, the second wafer 120 may function as a handling wafer for the wafer stack and may accordingly be formed by a non-semiconductor material, for instance a dielectric material such as a glass material. Following formation of the vias 140, the second wafer 120 may be thinned or even removed.

FIG. 4a through 4d illustrate a further example sequential integration process which is particularly suitable for a hetero-integration approach.

FIG. 4a shows a wafer stack including a first wafer 210 and a second wafer 220. The layers/wafers 210, 212, 214, 216, 220, 222, 224, 226 forming part of the wafer stack corresponds to the layers/wafers 110, 112, 114, 116, 120, 122, 124, 126 of the wafer stack shown in FIG. 3a. The wafer stack including the first wafer 210 and the second wafer 220 may be formed in the manner described in connection with FIG. 3a.

Accordingly, a first device region 212 is formed on a front side 210a of the first wafer 210. At least one interconnection layer 114 is formed on the first device region 112. A bonding layer 116 is formed on the interconnection layer 114. Similar to the first wafer 210, a device region 222, an interconnection layer 224, and a bonding layer 226 is formed on the front side 220a of the second wafer 120. The first wafer 210 is bonded to the second wafer 220 with the front side 210a of the first wafer 210 facing a front side 220a of the second wafer 220. A bonding layer 218 similar to bonding layers 216, 226 is formed on top of the wafer stack.

FIG. 4a also shows a stack of layers including a bottom substrate 250 and a semiconductor layer 252. The semiconductor layer 252 is formed with a back side 252b facing the bottom substrate 250. A bonding layer 256 similar to the bonding layer 218 is formed on the front side 252a of the semiconductor layer 252.

The bottom substrate 250 may include a Si-layer. A semiconductor layer 252 of a Ge-layer, a group III-V material layer may be grown on the Si-layer of the bottom substrate 250 in a conventional manner, with or without an intermediate SRB. The semiconductor layer 252 may also be formed as a layer stack including a Ge-layer epitaxially grown on the Si-layer of the bottom substrate 250, with or without an intermediate SRB, and a group III-V material layer epitaxially grown on the Ge-layer, with or without an intermediate SRB. The bottom substrate 250 may also be formed of a semiconductor material other than Si, for instance Ge, SiGe, SiC, GaAs or InP. The bottom substrate 250 may also be a SOI wafer, a GeOI wafer, SiGeOI wafer or a III-V-OI wafer. The bottom substrate 250 may alternatively function merely as a handling wafer and be formed of a dielectric material, such as a glass material.

Optionally, a device region (which may be referred to as a third device region) including a set of semiconductor devices may be formed on the front side 252a of the semiconductor layer 252. At least one interconnection layer for electrically interconnecting the semiconductor devices of the device region on the front side 252a may be formed on the device region. The optional presence of a device region and at least one interconnection layer is indicated by the dashed box 254 in FIG. 4a but will be omitted from the further discussion and figures for illustrational clarity.

At the right-hand side of FIG. 4a is shown a wafer stack formed by bonding the stack including the bottom substrate 250 and the semiconductor layer 252 to a back side 210b of the first wafer 210 with the front side 252a of the semiconductor layer 252 facing the back side 210b of the first wafer 210. The bonding is achieved by the bonding layers 256, 218.

In FIG. 4b, the bottom substrate 250 has been removed to expose the back side 252b of the semiconductor layer 252. Removing the bottom substrate 250 may include grinding, CMP and/or etch back from the back side bottom substrate 250 until the semiconductor layer 252 is exposed (e.g. the Ge-layer or the SRB, if present).

As shown in FIG. 4b, an optional thinning of the semiconductor layer 252 may be performed to form a thinned semiconductor layer 252'. The thinning may include grinding, CMP and/or etch back from the back side 252b of the semiconductor layer 252.

In FIG. 4c, a device region 232 (which may be referred to as a second device region of the first wafer 210 since the semiconductor layer 252 is bonded to the first wafer 210) is formed on the back side 252b of the semiconductor layer 252'. The device region 232 includes a set of semiconductor devices and defines a second FEOL layer of the first wafer 110. At least one interconnection layer 234 is formed on the device region 232. The at least one interconnection layer 234 forms a BEOL layer with respect to the device region 232.

The device region 232 and the at least one interconnection layer 234 may be implemented in a similar manner as outlined in connection with the second device region 132 and the at least one interconnection layer 134 in FIG. 3b, respectively. Accordingly, in an example embodiment all FEOL processing steps relating to the device region 232, as well as BEOL processing steps relating to the at least one interconnection layer 234, are performed at temperatures below 600° C. or in an example embodiment below 500° C. to avoid affecting BEOL layers and other FEOL layers already present in the wafer stack.

In FIG. 4d, a number of vias 240 is formed to extend through the wafer stack (by way of example four vias). The vias 240 may be formed with a similar structure and in a similar manner as the above described vias 140.

Following forming of the structure shown in FIG. 4d, further back end processing may be performed as described in connection with FIG. 3c.

In an example variation of the process described with reference to FIG. 4a-d, in an example embodiment the at least one interconnection layer 214 may not be present on the first device region 212. Furthermore, in an example embodiment, the device region 222 and/or the at least one interconnection layer 224 may not be present on the second wafer 220. Hence, in a basic variation of the above-described process, device regions may be formed only on the front side 210a of the first wafer 210 and on the back side 252b of the semiconductor layer 252/252' (which is bonded to the back side 210b of the first wafer 210). In that case, the second wafer 220 may function as a handling wafer for the wafer stack and may accordingly be formed by a non-semiconductor material, for instance a dielectric material such as a glass material. Following formation of the vias 240, the second wafer 220 may be thinned or even removed.

FIG. 5a through 5d illustrate a further example sequential integration process which is particularly suitable for a hetero-integration approach.

Figure 5A:
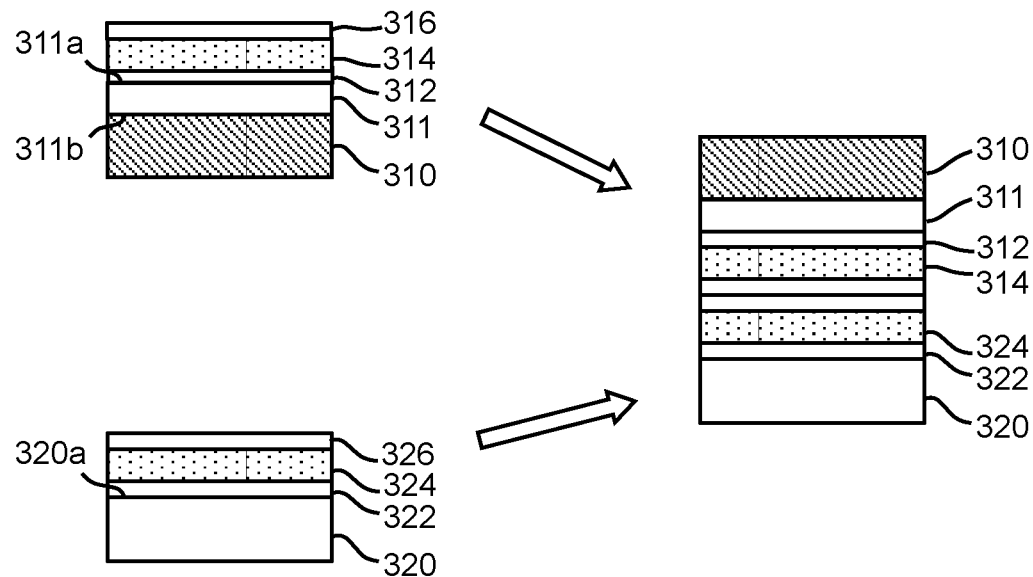
FIGS. 5a, 5b, 5c, and 5d are schematic illustrations of a sequential integration process, according to an example embodiment.

FIG. 5a shows a first wafer including a layer stack comprising a bottom substrate 310 and a semiconductor layer 311. The semiconductor layer 311 is formed with a back side 311b facing the bottom substrate 310. A first device region 312 is formed on a front side 311a of the semiconductor layer 311. The first device region 312 includes a set of semiconductor devices and defines a first FEOL layer of the first wafer. At least one interconnection layer 314 is formed on the first device region 312. A bonding layer 316 similar to any of the above-described bonding layers is formed on the at least one interconnection layer 314.

The bottom substrate 310 may include a Si-layer. A semiconductor layer 311 of a Ge-layer, a group III-V material layer may be grown on the Si-layer of the bottom substrate 310 in a conventional manner, with or without an intermediate SRB. The semiconductor layer 311 may also be formed as a layer stack including a Ge-layer epitaxially grown on the Si-layer of the bottom substrate 310, with or without an intermediate SRB, and a group III-V material layer epitaxially grown on the Ge-layer, with or without an intermediate SRB. The bottom substrate 310 may also be formed of a semiconductor material other than Si, for instance Ge, SiGe, SiC, GaAs or InP. The bottom substrate 310 may also be a SOI wafer, a GeOI wafer, SiGeOI wafer or a III-V-OI wafer. The bottom substrate 310 may alternatively function merely as a handling wafer and be formed of a dielectric material, such as a glass material.

FIG. 5a also shows a second wafer 320. The wafer/layers 320, 322, 324, 326 corresponds to the wafer/layers 120, 122, 124, 126 of the second wafer 120 shown in FIG. 3a.

At the right-hand side of FIG. 5a is shown a wafer stack formed by bonding the semiconductor layer 311 of the first wafer to the second wafer 320 with the front side 311a of the semiconductor layer 311 facing a front side 320a of the second wafer 320. The bonding is achieved by the bonding layers 316, 326.

Figure 5B:
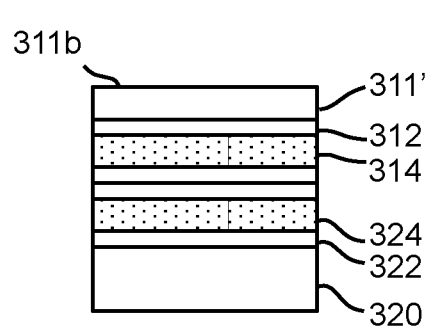

In FIG. 5b, the bottom substrate 310 of the first wafer has been removed to expose the back side 311b of the semiconductor layer 311. Removing the bottom substrate 350 may include grinding, CMP and/or etch back from the back side bottom substrate 350 until the semiconductor layer 311 is exposed (e.g. the Ge-layer or the SRB, if present).

As shown in FIG. 5b, an optional thinning of the semiconductor layer 311 may be performed to form a thinned semiconductor layer 311'. The thinning may include grinding, CMP and/or etch back from the back side 311b of the semiconductor layer 311.

Figure 5C:
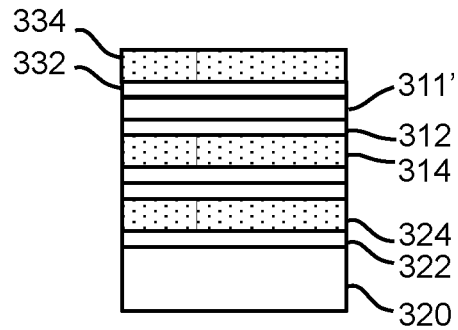

In FIG. 5c, a device region 332 (which may be referred to as a second device region of the first wafer) is formed on the back side 311b of the semiconductor layer 311'. The device region 332 includes a set of semiconductor devices and defines a second FEOL layer of the first wafer. At least one interconnection layer 334 is formed on the device region 332. The at least one interconnection layer 334 forms a BEOL layer with respect to the device region 332.

The device region 332 and the at least one interconnection layer 334 may be implemented in a similar manner as outlined in connection with the second device region 132 and the at least one interconnection layer 134 in FIG. 3b, respectively. Accordingly, in an example embodiment, all FEOL processing steps relating to the device region 332, as well as BEOL processing steps relating to the at least one interconnection layer 334, are performed at temperatures below 600° C. or in an example embodiment below 500° C. to avoid affecting BEOL layers and other FEOL layers already present in the wafer stack.

Figure 5D:
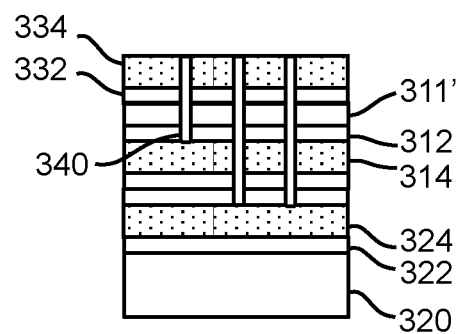

In FIG. 5d, a number of vias 340 is formed to extend through the wafer stack (by way of example three vias). The vias 340 may be formed with a similar structure and in a similar manner as the above described vias 140.

Following forming of the structure shown in FIG. 5d, further back end processing may be performed as described in connection with FIG. 3c.

In an example variation of the process described with reference to FIG. 5a-d, in an example embodiment the at least one interconnection layer 314 may not be present on the first device region 312. Furthermore, in an example embodiment, the device region 322 and/or the at least one interconnection layer 324 may not be present on the second wafer 320. Hence, in a basic variation of the above-described process, device regions may be formed only on the front side 311a of the semiconductor layer 311 of the first wafer and on the back side 311b of the semiconductor layer 311/311'. In that case, the second wafer 320 may function as a handling wafer for the wafer stack and may accordingly be formed by a non-semiconductor material, for instance a dielectric material such as a glass material. Following formation of the vias 340, the second wafer 320 may be thinned or even removed.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A process comprising:
    forming a wafer stack by bonding a first wafer to a second wafer with a front side of the first wafer facing a front side of the second wafer, the first wafer including a first device region formed on the front side of the first wafer and including a first set of transistors;
    subsequent to bonding the first wafer to the second wafer, forming a second device region on a back side of the first wafer, the second device region including a second set of transistors that are distinct from the first set of transistors;
    forming an interconnection layer on the second device region for electrically interconnecting the second set of transistors; and
    forming a via extending through the wafer stack from the interconnection layer and through the first wafer,
    wherein the first wafer includes a semiconductor layer, the first device region being formed on a front side of the semiconductor layer, and wherein the process further comprises:
    subsequent to the bonding to the second wafer, forming the second device region on a back side of the semiconductor layer,
    wherein the first wafer includes a bottom substrate, the back side of the semiconductor layer facing the bottom substrate, and wherein the process further comprises:
    subsequent to the bonding to the second wafer, removing the bottom substrate from the semiconductor layer to expose the back side of the semiconductor layer and thereafter forming the second device region on the back side of the semiconductor layer,
    wherein the bottom substrate includes a Si-layer and the semiconductor layer is formed by a Ge-layer, a group III-V layer, or a stack including a group III-V layer formed on a Ge-layer.

2. The process according to claim 1, further comprising bonding a semiconductor layer to the back side of the first wafer with a front side of the semiconductor layer facing the back side of the first wafer, wherein the forming of the second device region includes forming the second device region on a back side of the semiconductor layer.

3. The process according to claim 1, wherein a semiconductor material forming the second set of transistors is different from a semiconductor material forming the first set of transistors.

4. The process according to claim 2, wherein the semiconductor layer is formed on a bottom substrate, and wherein the process further comprises:
    subsequent to the bonding of the semiconductor layer to the back side of the first wafer, removing the bottom substrate from the semiconductor layer to expose the back side of the semiconductor layer and thereafter forming the second device region on the back side of the semiconductor layer.

5. The process according to claim 4, wherein the bottom substrate includes a Si-layer and the semiconductor layer is formed by a group IV-layer, a group III-V layer, or a stack including a group III-V layer formed on a Ge-layer.

6. The process according to claim 2, further comprising forming a third device region including a third set of transistors on the front side of the semiconductor layer.

7. The process according to claim 6, further comprising forming an additional interconnection layer on the third device region for electrically interconnecting the third set of transistors.

8. The process according to claim 1, wherein the forming of the second device region comprises forming the second device region directly on the back side of the first wafer.

9. The process according to claim 8, further comprising thinning the first wafer subsequent to the bonding of the first wafer to the second wafer, wherein the second device region is formed on the back side of the thinned first wafer.

10. The process according to claim 1, further comprising forming an additional interconnection layer on the first device region for electrically interconnecting the first set of transistors.

11. The process according to claim 1, further comprising forming a third device region on the front side of the second wafer that includes a third set of transistors.

12. The process according to claim 11, further comprising forming an additional interconnection layer on the third device region for electrically interconnecting the third set of transistors.

* * * * *